United States Patent [19]

Wanesky

[11] 3,988,196
[45] Oct. 26, 1976

[54] APPARATUS FOR TRANSFERRING AN ORIENTED ARRAY OF ARTICLES

[75] Inventor: William R. Wanesky, Wescosville, Pa.

[73] Assignee: Western Electric Company, Inc., New York, N.Y.

[22] Filed: July 31, 1975

[21] Appl. No.: 600,758

Related U.S. Application Data

[60] Division of Ser. No. 232,735, March 8, 1972, Pat. No. 3,899,379, which is a division of Ser. No. 64,898, July 30, 1970, Pat. No. 3,690,984, which is a division of Ser. No. 729,859, April 10, 1968, Pat. No. 3,632,074, which is a continuation-in-part of Ser. No. 673,900, Oct. 9, 1967, abandoned.

[52] U.S. Cl. ............................... 156/541; 29/203 V; 29/559; 156/584; 214/1 BS; 248/362
[51] Int. Cl.² ........................................... B23Q 7/00
[58] Field of Search ........... 156/541, 540, 584, 344, 156/285, 230, 155, 235, 297, 299; 206/330, 329, 328, 808; 29/203 B, 203 V, 626, 559; 214/1 B, 1 BS; 269/21; 248/350, 362, 363

[56] References Cited
UNITED STATES PATENTS

| | | | |
|---|---|---|---|
| 1,287,793 | 12/1918 | Tillyer et al. | 156/155 |
| 2,978,804 | 4/1961 | Soper et al. | 29/583 |
| 2,984,897 | 5/1961 | Godfrey | 156/155 |
| 3,279,969 | 10/1966 | Borchardt | 156/235 |
| 3,448,510 | 6/1969 | Bippus et al. | 29/413 |
| 3,494,017 | 2/1970 | Tyler | 29/559 |
| 3,497,948 | 3/1970 | Wiesler et al. | 29/559 |
| 3,515,607 | 6/1970 | Wanesky | 156/17 |
| 3,562,057 | 2/1971 | McAlister et al. | 156/300 |
| 3,562,058 | 2/1971 | Boyd | 156/300 |
| 3,586,559 | 6/1971 | Shepard | 156/155 |

*Primary Examiner*—William A. Powell
*Assistant Examiner*—Michael W. Ball
*Attorney, Agent, or Firm*—W. O. Schellin; P. J. Tribulski

[57] ABSTRACT

An oriented array of small, fragile electrical devices such as beam lead transistors or integrated circuits, partially embedded in wax, are removed from the wax and transferred to a releasable mounting without disrupting the orientation of the devices. The releasable mounting comprises a plate with a layer of silicone rubber or resin which exerts a suction or vacuum holding force on the array of oriented devices.

4 Claims, 33 Drawing Figures

APPARATUS FOR TRANSFERRING AN ORIENTED ARRAY OF ARTICLES

CROSS REFERENCE TO RELATED APPLICATION

This is division of application Ser. No. 232,735, filed Mar. 8, 1972, now U.S. Pat. No. 3,899,379 which is a division of application Ser. No. 64,898, filed July 30, 1970, now U.S. Pat. No. 3,690,984 which is a division of application Ser. No. 729,859, filed Apr. 10, 1968, now U.S. Pat. No. 3,632,074 which is a continuation-in-part of application Ser. No. 673,900, filed on Oct. 9, 1967, now abandoned.

BACKGROUND OF THE INVENTION

This invention is particularly adapted for use in the manufacture of small, fragile semiconductor devices or integrated circuits of the so-called beam lead type. Examples of these beam lead devices are disclosed in M. P. Lepselter U.S. Pat. Nos. 3,287,612 and 3,335,338. The invention is adapted to be used in conjunction with picking up, holding and maintaining orientation of small articles, but will be particularly described with respect to beam lead transistor devices which comprise a semiconductor body on which leads bonded as an integral part of the device extend from the body like cantilever beams to form both electrical and mechanical connections to a header or circuit pattern formed on a substrate. These beam leads are essentially of gold which is electroplated onto a semiconductor body which will be hereinafter designated a wafer.

A typical beam lead device is very minute, the leads being only 10 microns thick, 3 mils wide and 9 mils long while a square wafer body is only 2 mils thick and 18 mils wide.

In batch manufacture of these fragile devices, a plurality of arrays of beam leads are electroplated to extend from a number of active or doped areas formed in a slice or sheet of semiconductor material such as silicon. The slice is secured to a mounting plate with wax so that the beam leads are embedded in the wax. The nonwaxed surface of the slice is masked with a photosensitive resist to expose the areas between individual transistors and these exposed areas are etched to separate and form a plurality of individual beam lead transistor devices.

Heretofore, the resist and wax were removed by use of suitable solvents. This treatment resulted in a loss of the orientation of the transistor devices on the mounting plate, or if the devices were left in an oriented array on the plate, there was no way of moving the plate from the fabrication location to another manufacturing location without loss of the device orientation. A number of mechanical apparatus of the vibratory or shaker type were developed and tried in an attempt to regain orientation of the devices to enable subsequent manufacturing operations to be performed on the devices. However, these apparatus proved less than satisfactory because of damage to the beam lead device or slow operating capabilities in providing a supply of devices for the subsequent manufacturing operations. These subsequent operations may include testing of the devices or the assembly and bonding of the devices into integrated circuit modules. For economic mass production, it would be advantageous if the devices could be transferred from the batch fabrication location in oriented array to permit facile handling, feeding or loading of the devices into automatic testing or bonding machines.

The need for maintaining device orientation without individual handling of the devices may be further appreciated by noting that it is very difficult to transfer beam lead devices of this minute size without damaging or bending the leads, or without chipping or scratching the wafers.

SUMMARY OF THE INVENTION

The present invention contemplates new and improved methods of handling beam lead devices during manufacturing operations, while maintaining device orientation and decreasing the likelihood of damage to the devices. More particularly, in one embodiment of the invention the beam lead devices, partially embedded in a wax layer on a mounting plate, are cleaned of a photoresist coating and then temporarily secured to an intermediate holding device while the wax and the mounting plate are removed. Next, the exposed portions of the devices are pressed against a carrier plate which exerts an attractive vacuum force on the devices. Finally, the intermediate holding device is removed leaving the devices in the original orientation on the carrier plate. The attractive force exerted by the carrier plate is sufficient to hold the devices in the original orientation during shipment to another manufacturing location where each device can be easily removed from the carrier plate and bonded or connected to a circuit module.

The invention also contemplates a carrier, or a mounting plate coated or otherwise constructed of, or provided with a layer of, silicone rubber or resin which engages and applies a vacuum or suction holding force to the individual transistor devices or other articles. This vacuum holding force is sufficient to maintain device orientation during subsequent handling or transfer, but yet the force is small enough to permit easy removal of the devices by use of a vacuum pickup or a pair of tweezers. The pressure sensitive vacuum holding properties of the carrier may be controlled by changing such parameters as the size of the contacted area, the surface roughness or configuration and the thickness of the coating or carrier.

DETAILED DESCRIPTION

Figure 1:
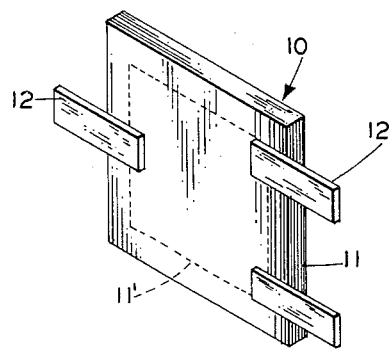
FIG. 1 is a greatly enlarged perspective view of a beam lead transistor device which may be effectively transferred from a mounting plate onto a carrier plate in accordance with the principles of the present invention.

Referring to FIG. 1, there is shown a beam lead transistor device 10 comprising a semiconductor body, or wafer, 11 having a doped or active area 11' in communication with three beam leads 12 extending in cantilevered fashion as integral parts of the wafer. One embodiment of the invention will be explained with respect to the handling of beam load transistor devices. As previously explained, a great multitude of beam lead transistor devices 10 are simultaneously fabricated from a single silicon slice, e.g., 1200 devices may be formed from a slice having a diameter of 1 inch. Upon separation of the individual transistor devices, they are maintained in orientation due to the fact that the slice was originally secured by a pliant cement, such as wax 13 (FIGS. 2 and 3), to a sapphire or aluminum oxide or glass mounting disc 14. The pliant cement is selected to be removable or releasable upon the application of heat and/or a solvent. It is desired in the practice of this embodiment of the inventive method that the transistor devices 10 be removed from the wax 13 and placed on a carrier which can be transported to another manufacturing area for subsequent processing of the transistor devices.

Figure 2:
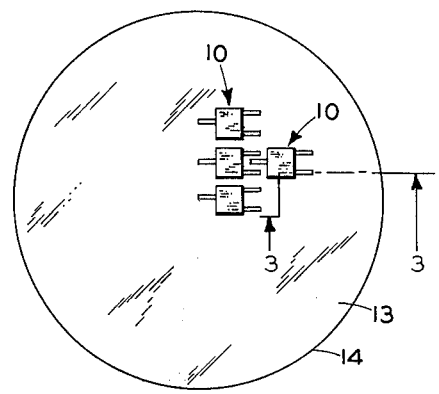
FIG. 2 discloses a disc-like mounting plate having a layer of wax which serves to partially embed an oriented array of transistor devices following device fabrication.
Figure 3:
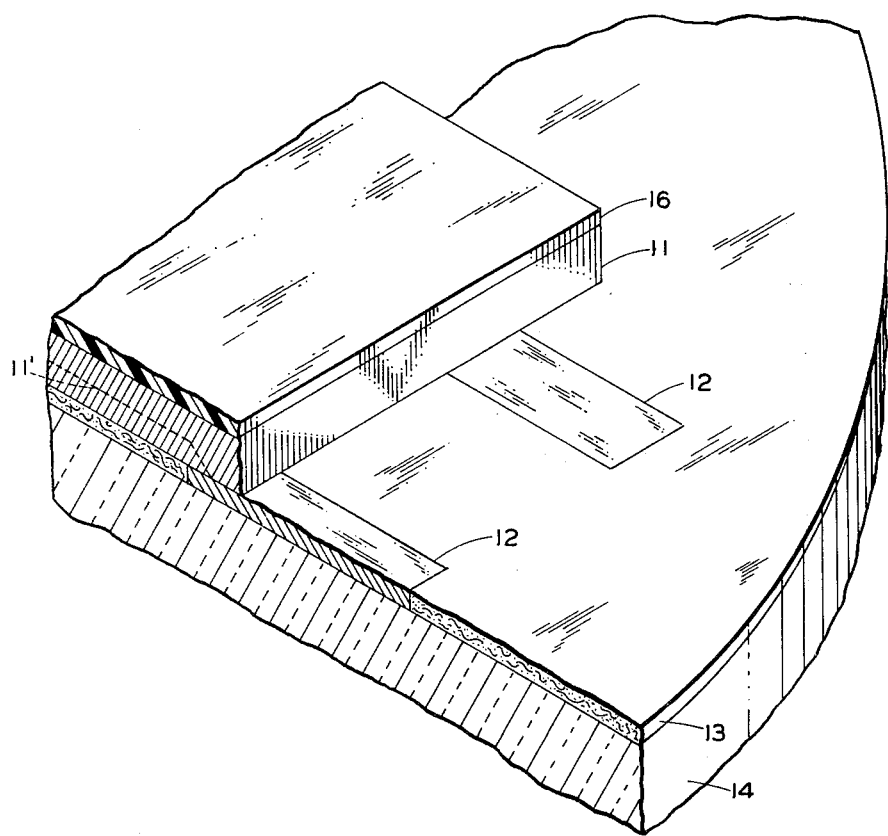
FIG. 3 is a perspective, sectional view, again greatly enlarged, taken along line 3—3 of FIG. 2, showing a portion of one device embedded in wax and also disclosing a photoresist layer on a semiconductor wafer or chip of the device.

Referring to FIG. 3, it will be noted that the beam 12 is fully embedded in the wax 13 while the transistor wafer 11 is fully exposed except for active area side 11'. During the fabrication of the individual transistor devices, each was masked with a photoresist 16 to leave exposed the intervening spaces between the individual devices. The exposed intervening surfaces were etched, thus leaving an array of separated, individual transistor devices embedded in wax, as shown in FIG. 2. The resist 16, which may be of the type sold by the Eastman Kodak Company under the trade designation KTFR, may be removed by projecting a pressurized fluid stream 17 (FIG. 4) from a nozzle 18 in the manner taught in W. R. Wanesky U.S. Pat. No. 3,515,607. The fluid stream 17 works its way under the photoresist layer 16 to peel the resist layer from the wafer 11, leaving the beam lead transistor devices 10 embedded in the wax 13 as depicted in the right-hand portion of FIG. 4.

Figure 5:
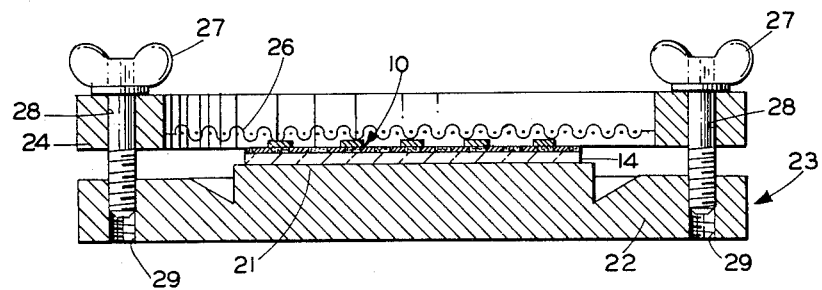
FIG. 5 shows a cross section of a fixture wherein a screen is stretched across the oriented array of transistor devices in preparation for temporary securing of the transistors and the mounting plate to the screen.
Figure 6:
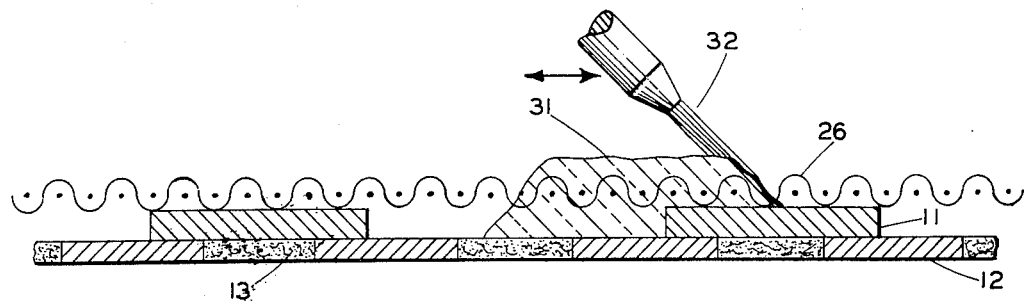
FIG. 6 is a sectional view illustrating the application of a soluble adhesive through the screen to secure the transistors to the screen.

Considering now the steps in removing the wax, the sapphire mounting plate 14, along with the wax embedded devices 10, are placed on a flat pedestal 21 (see FIG. 5) projecting from a circular base 22 of a fixture 23. The fixture includes an annular ring 24 across which is stretched a fine mesh screen 26, e.g., stainless steel 230 mesh screen. The screen mesh should be selected so that several openings are presented to each transistor device while being of sufficient size to allow for the flow of liquid therethrough. The annular ring 24 is assembled on the base 22 and may be secured thereto by fasteners 27, which are illustrated as wing bolts extending through bores 28 and into threaded apertures 29 formed about the peripheral area of the base 22. In the practice of this step of the method, it is not necessary to draw up the wing bolts 27, it being sufficient to merely place the screen 26 over the exposed transistor devices 10. As shown in FIG. 6, an adhesive or hardenable material 31, such as cellulose nitrate or cellulose acetate, is now sprayed or otherwise spread over the screen 26 to embed and secure the wafers 11 in place. The wafers 11 are thus cemented in the original orientation to the screen which serves as an intermediate holder in the transfer process. A brush 32, or pallet spreader, may be utilized to facilitate the even distribution and flow of the cellulose nitrate through the screen and about the wafers 11.

Figure 7:
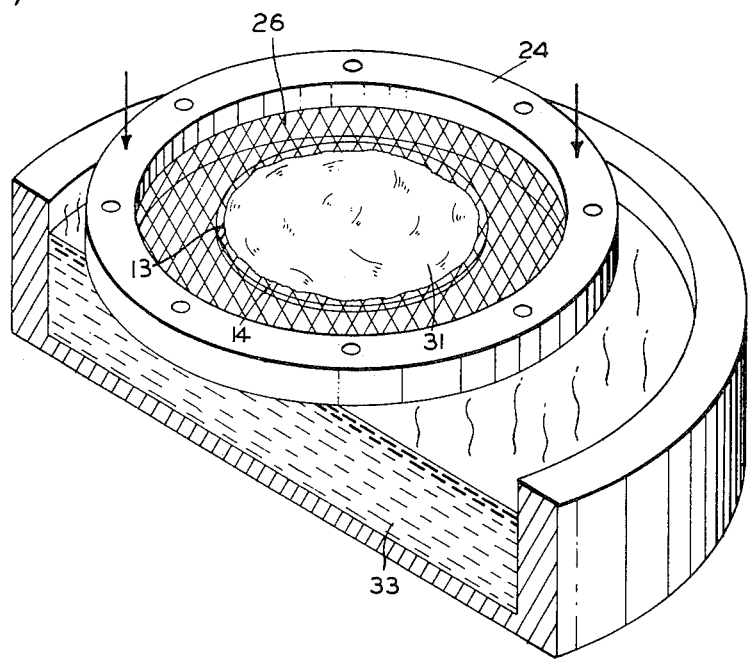
FIG. 7 depicts the immersion of the transistor devices, the screen and a part of the fixture in a solvent that acts to dissolve the wax.

Next, it is desired that the wax 13 be removed to release the sapphire mounting plate 14. First, the wax 13 may be softened by application of heat allowing the mounting plate and a good portion of the wax to be lifted or peeled from the transistor devices 10. The removal of the remaining wax may be accomplished, as illustrated in FIG. 7, by immersing the annular ring 24, the screen 26 and the adhered to oriented array of wafers 11, along with the remaining wax 13 and the mounting plate 14, in a bath 33 of boiling trichloroethylene or other solvent that will dissolve the wax, but not the adhesive 31. The trichloroethylene acts as a solvent to remove the wax from the completely exposed undersurfaces of the devices 10, but does not destroy the bonding strength of the cellulose nitrate. Any residual wax, or other foreign particles, may be removed by applying a spray of trichloroethylene, or other suitable cleaning fluid, to the exposed undersides of the transistor devices.

Figure 9:
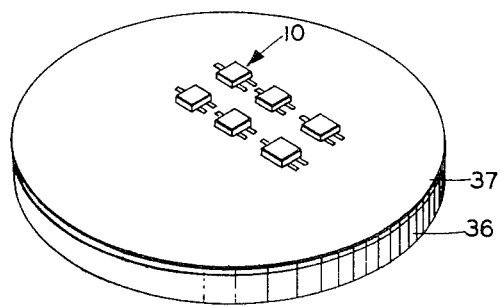
FIG. 9 shows the carrier plate vacuum holding an array of transistors in anticipation of subsequent handling or transportation.

It is now desired to transfer the transistor devices 10 onto a carrier plate, or disc, 36 such as illustrated in FIG. 9. The disc 36 has a layer or film 37 of pressure sensitive, vacuum holding material, such as silicone resin of the general type sold by the Dow Corning Corporation under the trade designation "Sylgard 182". Investigations revealed that the silicone resin possesses the property of releasably holding a smooth surface, nonporous device when such a device is pressed against the exposed surface of the resin.

Figure 8:
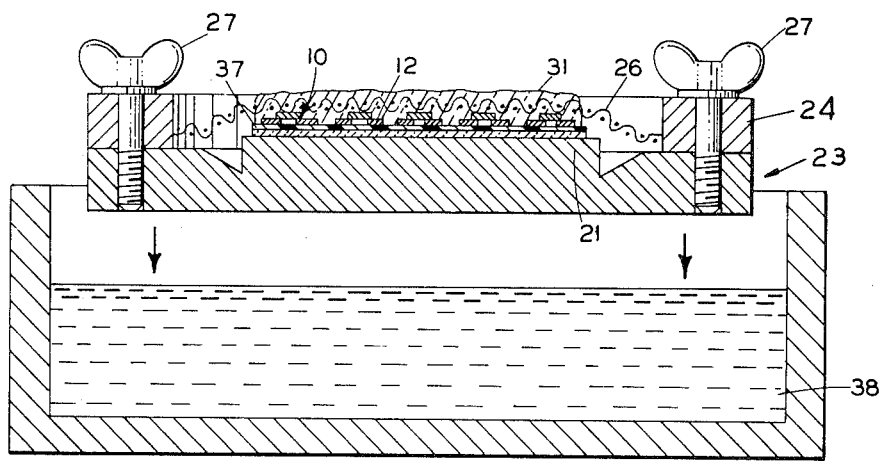
FIG. 8 shows the fixture reassembled with the de-waxed transistors urged into pressing engagement with a layer of silicone resin on a carrier plate in anticipation of immersion of the fixture into a tank of fluid solvent which acts to dissolve the temporary adhesive.

The coated disc 36 is placed on the pedestal 21 (see FIG. 8) and the ring 24 is secured in the fixture by tightening the wing bolts 27. The dewaxed beam lead transistor devices 10 are now sandwiched between the silicone resin layer 37 and the cellulose nitrate adhesive 31. The bolts 27 are drawn up to tension the screen 26 and force the undersides of the beam leads 12 into intimate contact with the surface of the silicone resin layer 37.

In a more preferred embodiment the coated disc 36 is placed on a movable pedestal 103 (see FIG. 29) which is in a lowered position. The ring 24 is placed in position on the lower portion 104 of a second fixture 105 and rests on spring-loaded plungers 106 of screw assemblies 107. The assemblies 107, each of which comprises a plunger 106 and screw 112 having a spring 113 mounted therebetween, are adjusted up or down to obtain a predetermined space 108 (see FIG. 30) between the ring 24 and the lower portion 104 of the fixture 105. Having been positioned to obtain the desired space 108, each assembly 107 is locked in place by a nut 109. The pedestal 103, with the coated disc 36 thereon, is raised from its lowered position until the coating 37 just touches the devices 10 attached to the screen 26. At this point, the pedestal 103 is locked to the lower portion 104 of the fixture 105 by means of a wing screw 110.

The space 108 is chosen so that when wing screws 27 (see FIG. 29) are tightened sufficiently to draw the ring 24 against the lower portion 104 of the fixture 105, the screen 26 will not be deformed beyond its elastic limit.

Figure 29:
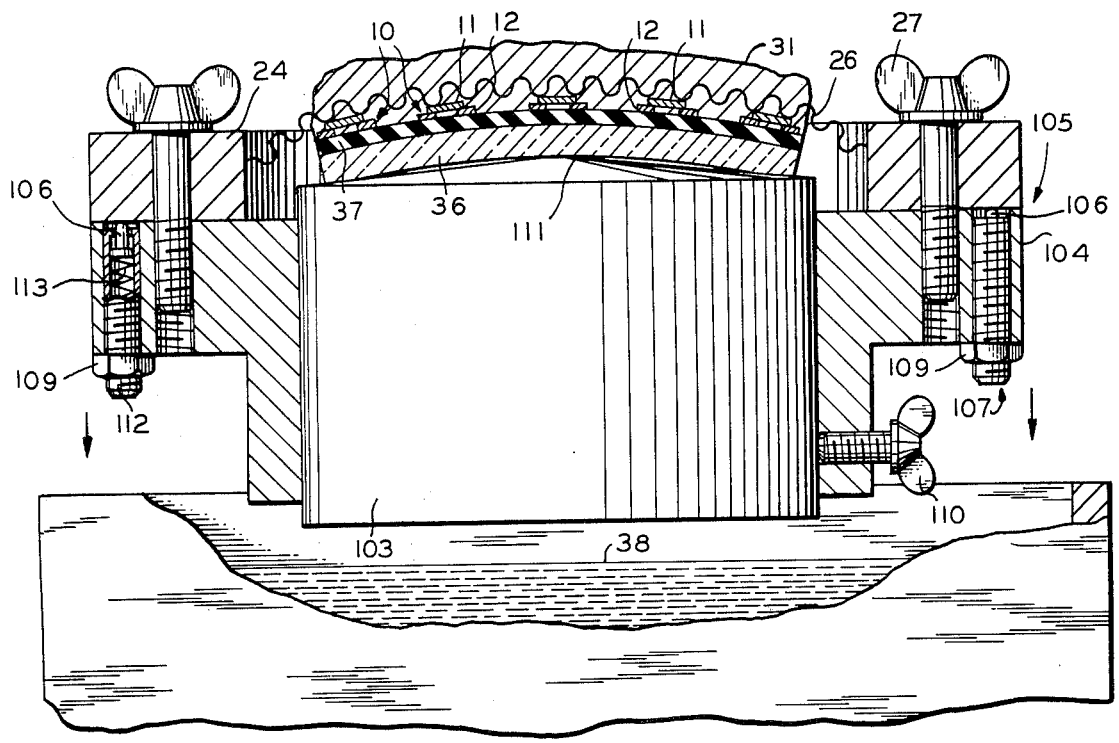
FIG. 29 is a cross-sectional view illustrating an alternative embodiment of the fixture shown in FIG. 5, wherein a screen is stretched across the oriented array of transistor devices positionied on a movable pedestal having a nonplanar surface in preparation for temporary securing of the transistors and the mounting plate to the screen.
Figure 30:
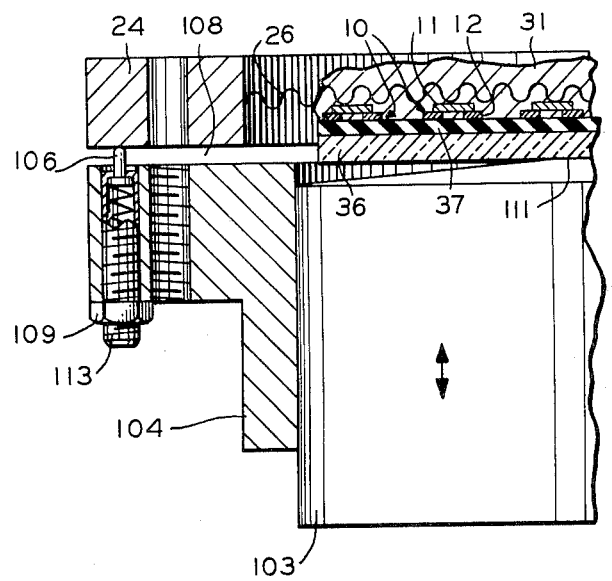
FIG. 30 is an enlarged cross section of a portion of the fixture shown in FIG. 29 illustrating the manner in which the screen is spaced a predetermined distance from the remainder of the fixture.

As illustrated in FIGS. 29 and 30, the top surface of pedestal 103 may be slightly convex or cone-shaped with the center of the surface 111, in any case, being elevated several thousandths of an inch above the outer periphery thereof. In addition, it is preferred that the elevated portion of the surface 111 include a flat area to add stability to the disc 36 when the ring 24 is unclamped. When the ring 24 is brought into contact with the lower portion 104 of the fixture, the screen 26 is drawn taut exerting a downward force on the disc 36 sufficient to cause it to take an approximately spherical shape, but not sufficient to cause the disc to fracture. Because the screen 26 is pulling down on the now dome-shaped or spherical surface of the disc 36, there exists downward components of force which press devices 10 anywhere on the screen against coating 37. This brings the underside of beam leads 12 into intimate contact with the surface of the silicone resin layer 37 and assures the transfer of all devices 10, particularly smaller ones.

Regardless of whether a flat pedestal 21 or a nonplanar, movable pedestal 103 is employed, the assembled fixture (23 or 105, respectively) is now immersed in a bath of solvent 38; e.g., acetone, to dissolve the cellulose nitrate. The fixture is removed from the bath and the wing bolts 27 loosened to remove the screen 26. The disc 36 may now be lifted and the beam lead transistors 10 will remain on the surface of the silicone resin layer 37 in the original orientation shown in FIG. 2. In addition, it will be noted that the fragile beam leads 12 are fully supported by either the wax 13, the intermediate cellulose nitrate adherent 31, or the silicone resin layer 37 during the various steps of the process, thereby substantially eliminating the possibility of bending or otherwise damaging the beam leads.

The carrier disc 36 may be constructed of a heat resistant glass with a 0.0005 inch to 0.001 inch silicone resin or rubber film. The glass disc is first primed for good adhesion of the silicone resin. When silicone resin is to be used as the film, then the primer may be of the type sold under the trade designation Sylgard primer by the Dow Corning Company and when silicone rubber is used, then the primer may be of the type sold under the trade designation "Silastic 1201" primer by the Dow Corning Company. The film coating may be cast on the surface of the glass disc and then a thin, flexible cover, with a surface of desired roughness, is placed against the coating after which the resin is cured. The surface of the silicone layer will be an exact reproduction of the surface of the cover which is peeled away after curing. It has been further discovered that the surface roughness is directly related to the ability of the silicone resin to hold objects pressed against the surface; the smoother the surface, the greater the holding ability. It has also been found that thicker, softer layers of silicone resin or rubber exhibit greater holding abilities. Experiments have shown that porous objects, such as paper, do not adhere to the silicone resin surface which leads to the theory that a vacuum is produced between the object and the surface of the silicone resin, so that, when an object is pressed against the surface, it displaces the air therebetween.

When an oriented array of beam lead transistor devices are transferred to the silicone resin coated disc 36, the disc may be transported without loss of device orientation. The use of a transparent, heat resistant glass disc 36 with a silicone resin layer has the added advantage in that the entire assemblage is transparent, thus permitting visual inspection of the underside of the beam lead transistor devices 10. The transistor devices may be removed from the carrier by a vacuum probe, or by use of tweezers, and advanced into a bonding machine for subsequent connection to a circuit module or onto a header.

In the alternative, the disc 36 may be coated with silicone rubber, such as Silastic silicone rubber manufactured by the Dow Corning Company. The silicone rubber is opaque, but it does have the same pressure sensitive, vacuum holding properties exhibited by the silicone resin. Further, either the silicone resin, or the silicone rubber, may be formed on the disc 36 by placing small amounts of uncured resin or rubber on the disc and then spinning the disc at a high speed, such as 8000 rpm. Upon uniform spreading of the resin or rubber over the surface of the disc, the spinning is stopped, and the resin or rubber is allowed to completely cure and adhere to the disc 36. It will be observed that in both instances, only thin, film-like layers 37 of holding material are applied to the carrier disc. Film thickness of the magnitude of 0.0005 inch to 0.001 inch have proved effective in holding the oriented devices 10 during transportation, while allowing easy removal by tweezers or a vacuum pick up at the subsequent fabricating or assembly location.

Figure 10:
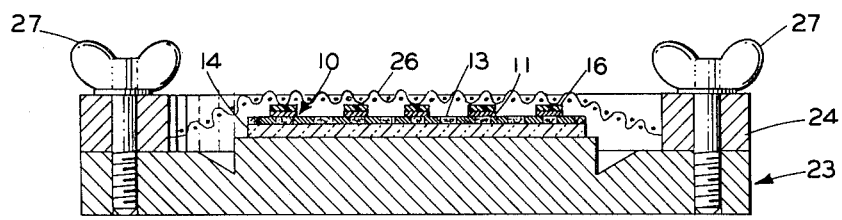
FIGS. 10, 11 and 12 illustrate an alternative embodiment of the invention wherein ice is used as an intermediate holder during the transfer of articles from a mounting plate to a pressure sensitive vacuum holding mounting.
Figure 11:
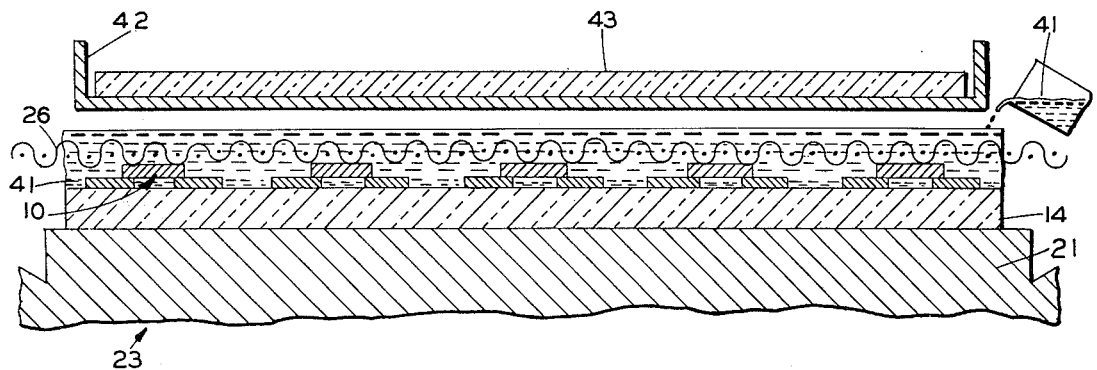
Figure 12:
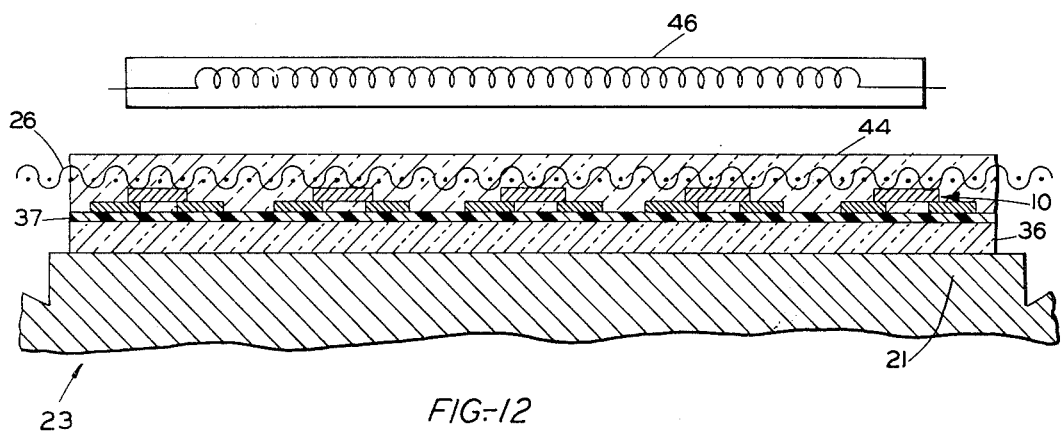
Figure 13:
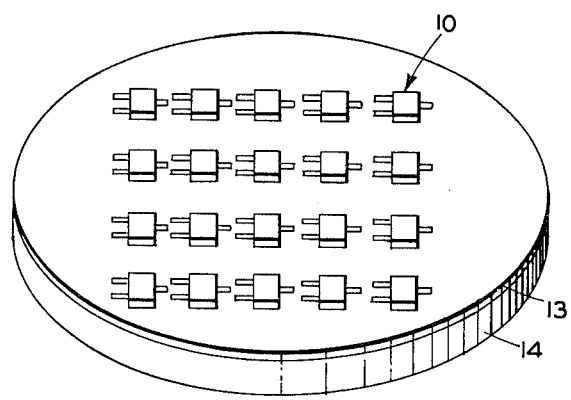
FIGS. 13, 14, 15 and 16 illustrate a method of the invention wherein articles are selectively transferred from a mounting plate to an intermediate holder constructed of a peelable adhesive, and then to a pressure sensitive, vacuum holding carrier.
Figure 14:
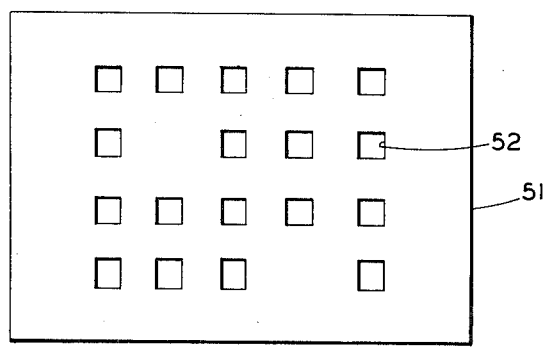

Attention is now directed to FIGS. 10, 11 and 12 for consideration of a second embodiment of the invention. Again, the mounting disc 14 is placed in the fixture 23 so that the screen 26 is resting on the tops of the transistor devices 10. In this instance, the photoresist layers 16 may be retained on the transistor wafers 11. The fixture 23 is now successively immersed in solvents that act to dissolve the wax 13 and the photoresist 16. Successive immersions in a resist etchant (such as sold under the trade designation J-100, by the Indust-Ri-Chem Labs, Richardson, Texas), trichloroethylene, and acetone remove both the photoresist 16 and the wax 13, leaving the device 10 retained by the screen 26 on the mounting plate 14. Next, a hardenable or solidifiable liquid, such as a few drops of water 41, is spread over the screen 26 to wet the screen 26 and the devices 10. The water 41 is then frozen by moving a suitable refrigerating device into the vicinity of the water; for example, a shallow copper receptacle 42 containing dry ice 43. The wing bolts 27 are now removed and the upper, annular ring section 24 is lifted to enable the removal of the mounting plate 14 to expose the undersurfaces of the devices. This mounting plate may be removed by the simple gripping with and manipulation of a pair of tweezers.

It is now desired to again transfer the ice-encased transistor devices 10 to a carrier plate 36 having a layer of pressure sensitive, vacuum holding material 37. As shown in FIG. 12, the carrier plate 36 is mounted on the pedestal 21 of the fixture 23 and the annular ring 24 is reassembled to move the transistor devices 10 against the pressure senstive, vacuum holding layer 37. The beam leads 12 are forced into intimate engagement with the layer 37 upon retightening of the wing bolts 27. The ice 44 is melted by bringing a suitable heating fixture 46 into proximity with the fixture 23. The ice melts and flows from the pedestal 21 and the remaining moisture is evaporated, leaving the screen 26 urging the devices 10 toward the layer 37. Again, the pressure senstive, vacuum holding layer 37 will exert a holding force on the beam leads 12 so that when the screen 26 is removed, the transistor devices 10 are arrayed on the layer 37 in the original orientation as depicted in FIG. 9.

Figure 4:
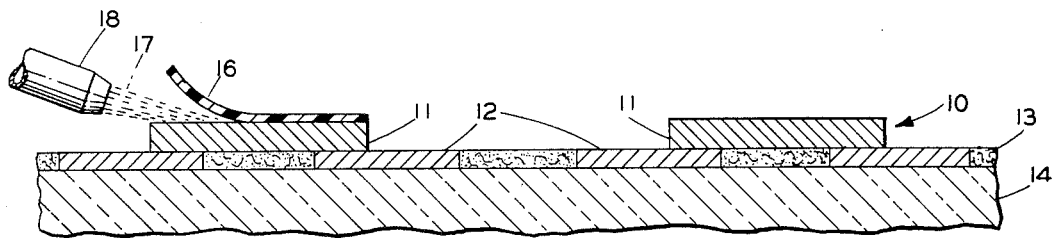
FIG. 4 is a sectional view through the array of oriented transistor devices and the mounting plate illustrating a fluid stream being applied to remove the photoresist.

It is to be understood that in the practice of this embodiment of the method, the resist layer 16 can be removed by a fluid blast as depicted in FIG. 4. In this instance, there is no need to immerse the assembled fixture 23 in a solvent for removing the photoresist 16, an immersion in boiling trichloroethylene being sufficient to dissolve the wax and clean the devices 10.

Referring now to FIGS. 13, 14, 15 and 16 for an understanding of a further embodiment of the invention wherein the transistor devices are not only transferred from the mounting plate 14 onto the carrier plate 36, but alos those transistor devices 10 found to be defective are removed and not transferred onto the carrier plate. Again, the devices 10 are embedded in a wax 13 on the mounting plate 14. The devices 10 can be visually checked or electrically tested to determine which devices in the array are defective. An intemediate holder in the form of a card 51 of a suitable smooth plastic, such as a polyester condensation product of ethylene glycol and terephthalic acid sold under the trade name Mylar, by E. I. du Pont de Nemours & Company, is punched with a coordinate array of apertures 52 corresponding to the devices 10 that passes inspection. It will be noted that no apertures appear in the aperture array which correspond to the defective devices in the device array cemented in the wax 13.

Figure 15:
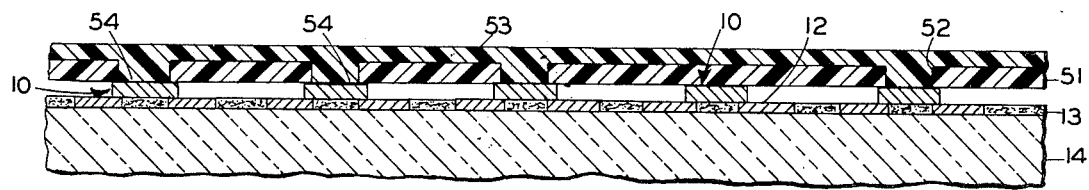
Figure 16:
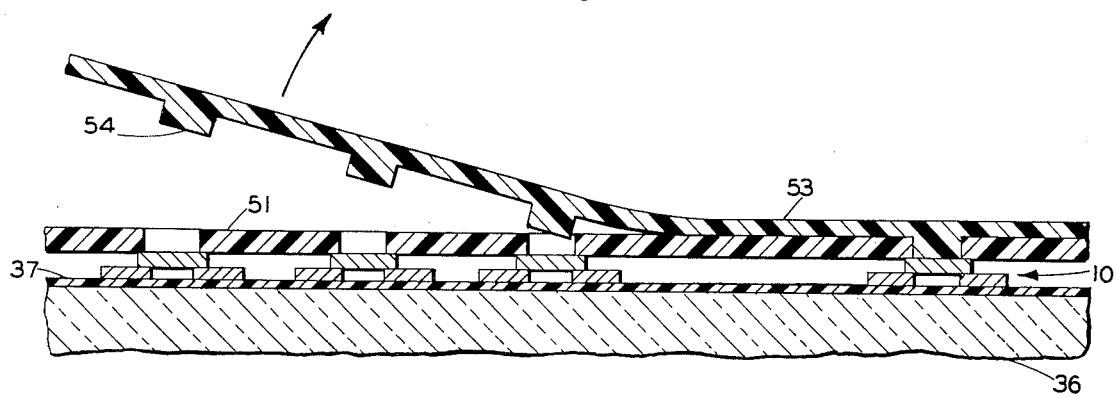

The card 51 is now positioned, as shown in FIG. 15, to align the apertures 52 with the satisfactory devices 10. In this instance, pressure sensitive, vacuum holding material acting as a peelable, adhesive is spread over the card 51, and through the apertures 52 into intimate engagement with the exposed top surfaces of the devices 10 to form an intermediate adherent layer 53. This layer is cured and the assemblage is then immersed in boiling trichloroethylene to dissolve the wax 13. Those devices 10 not contacted by the peelable, adhesive layer 53 are released and dropped into the tank of solvent. The mounting plate 14 is also released leaving the devices 10 clinging to projections 54 extending from the adherent, peelable layer 53. If any of the defective devices 10 are not washed away during the immersion in the solvent, they may be brushed from the card, leaving the satisfactory devices clinging to the projections 54. The card 51, with the layer 53 and the satisfactory devices 10, is then pressed against a layer of pressure sinsitive, vacuum holding material 37, as illustrated in FIG. 16. The card 51 is held and the layer 53 peeled away to withdraw the projections 54 from contact with the devices 10. The satisfactory devices 10 are now held, in their original orientation, on the pressure sensitive, vacuum holding layer 37 of the carrier plate 36.

Figure 17:
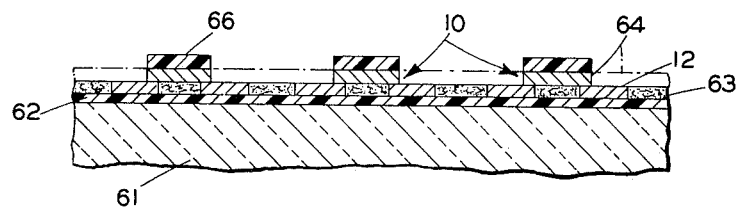
FIG. 17 illustrates addtional aspects of the method of the invention wherein beam lead devices embedded in wax are directly transferred onto a pressure sensitive vacuum holding layer.
Figure 18:
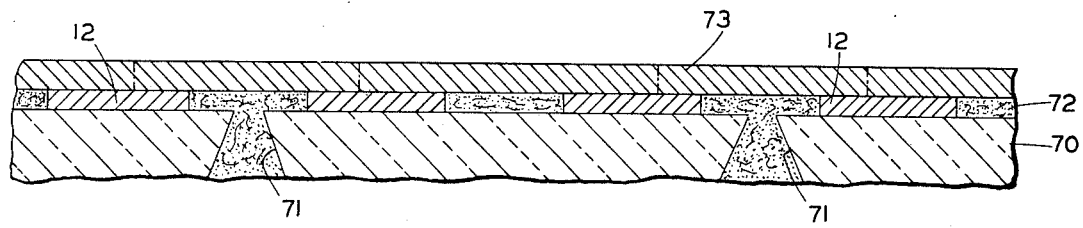
FIGS. 18, 19, 20, 21 and 22 graphically depict a further application of the principles of the invention wherein individual transistor devices are fabricated to be releasably supported by individual plugs constructed of pressure sensitive, vacuum holding material which acts as a peelable adhesive.
Figure 19:
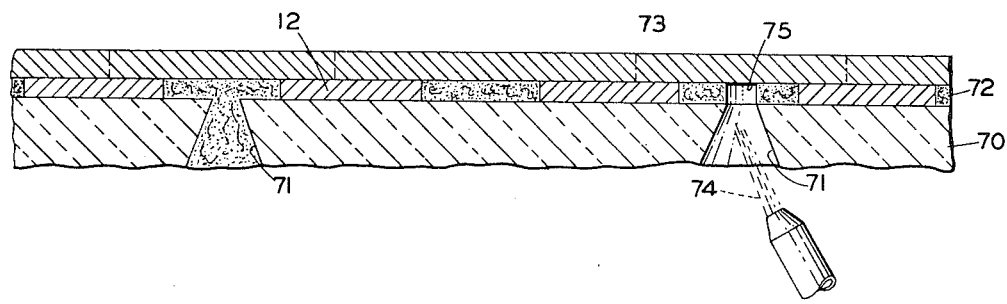

In another application of the principles of the invention, a carrier plate 61, (see FIG. 17) is provided with a thin layer 62 of pressure sensitive, vacuum holding material, such as silicone resin, and then a layer of liquid wax 63. A silicon slice 64, with the beam lead 12 side down, is pressed into the wax. As previously described, the slice is provided with a resist pattern 66 overlying the individual transistor devices 10. Again, the intervening exposed area (shown in dashed lines) of the slice 64 are etched away. Now, the carrier plate 61, with the wax-held devices 10, is placed on the pedestal 21 (see FIG. 5) of the fixture 23 and the screen 26 drawn down by tightening the wing bolts 27. This assemblage is immersed in a bath of boiling trichloroethylene to dissolve the wax. Upon removal from the bath, the annular ring 24 is removed leaving the oriented array of beam lead devices 10 on the underlying silicone resin layer 62. Again, the orientation of the devices is not disrupted by subsequent transport and permits removal of the devices by a vacuum pickup probe at an assembly station.

Referring now to FIGS. 18, 19, 20, 21 and 22, there is illustrated a modified method of fabricating individual transistor devices 10 so that each device is releasably supported and held on an individual plug of silicone resin or silicone rubber. First, a carrier plate 70 (FIG. 18) of ceramic is constructed and formed with a plurality of frustro-conical openings 71. Next, a layer of wax 72, such as glycol phthalate is spread over the plate 70 to cover the upper surface of the plate and incidentally fill the openings 71. A silicon slice 73 with arrays of beam leads 12 is pressed into the wax to imbed the leads with the centers of the devices over the centers of the upper extremities of the openings 71. The wax flowing into the hole 71 is now removed by directing a spray 74 (see FIG. 19) of solvent against the underside of the carrier plate 70. The spray also removed a portion of the wax layer 72 to expose areas 75 on the underside of the slice.

Figure 20:
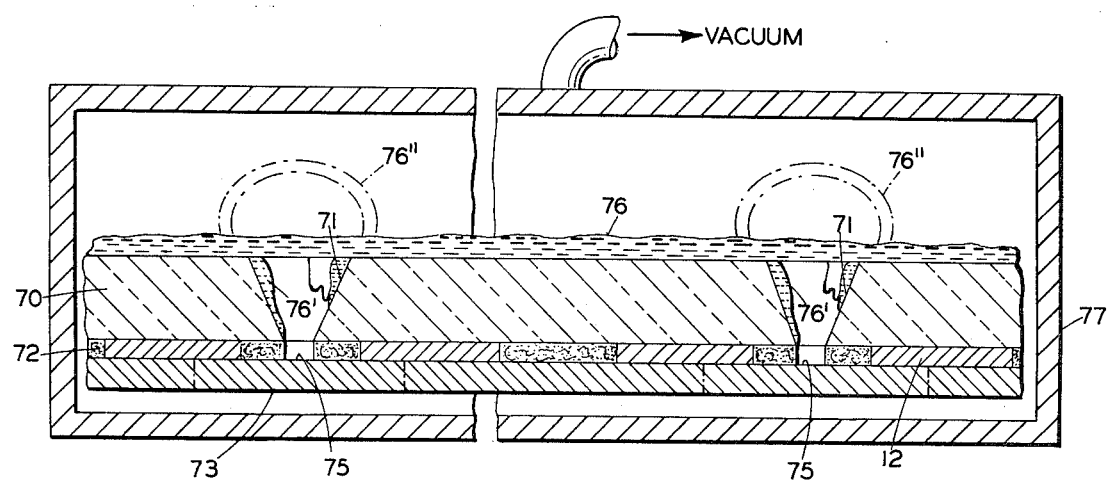
Figure 21:
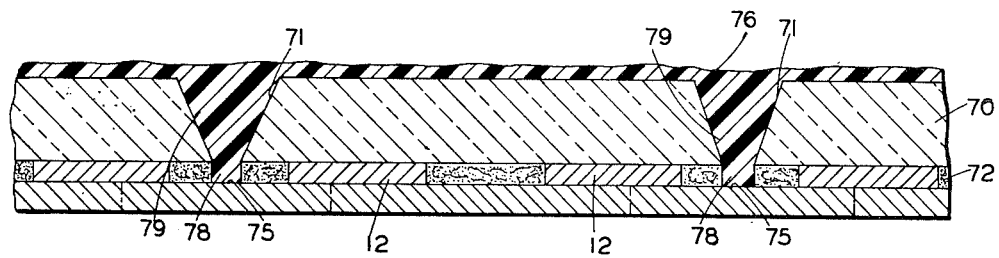

The next operation is to draw silicone resin or silicone rubber into the conical openings 71 to engage the now exposed undersurface areas 75 of the slice 73. The carrier plate 70 is inverted as shown in FIG. 20, and a layer 76 of uncured silicone resin or silicone rubber is spread over the top surface of the now inverted plate. Some resin 76' flows into the openings 71 but these openings are not completely filled because of the relatively high viscosity of the uncured resin and the small dimensions of the openings. As shown in FIG. 20, the plate 70 is placed in a vacuum chamber 77. Vacuum is developed within the chamber 77 and the air in the openings 71 is drawn into the chamber to bubble the resin, as depicted by the dash outline 76''. The bubbles 76'' will burst after limited expansion so that the vacuum will now be impressed within the openings 71. Again some of the silicone resin flows into the openings which are now subject to the same vacuum that appears in the chamber 77. However, these openings are still not completely filled.

The carrier plate 70 is removed from the vacuum chamber 77 whereupon ambient air pressure acts on the fluid silicone resin 76 to force the resin into the openings 71. The resin completely fills the openings 71 (see FIG. 21) and contacts the exposed surfaces 75 of the slice 73. The silicone resin is cured. From an inspection of FIG. 21, it will be noted that small projections 78 extend from the openings 71 through the openings formed by the removal of the wax 72. The ends of these small projections abut and exert a holding force on the exposed surfaces 75 of the slice.

Figure 22:
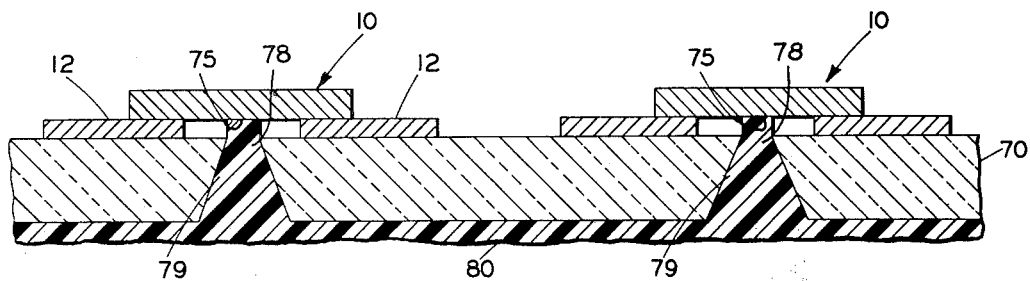

In the manner previously described, the slice 10 is masked with resist patterns over the individual transistor device areas. Again the slice is etched to form the individual transistor devices 10. Upon subsequent removal of the resist and the remaining wax by immersion in suitable solvents as previously described, the individual transistor devices 10 will be held, as shown in FIG. 22, on the end faces of the projections 78 extending from the now formed frustro-conical plugs 79 positioned in the openings 71. Each individual transistor device may be removed with tweezers or a vacuum probe. In the alternative, the remaining layer 80 of silicone resin may be peeled from the underside of the carrier plate 70 to remove the plugs 79 from the openings leaving the transistor devices freely supported and in the original orientation on the upper surface of the carrier plate 70.

Figure 23:
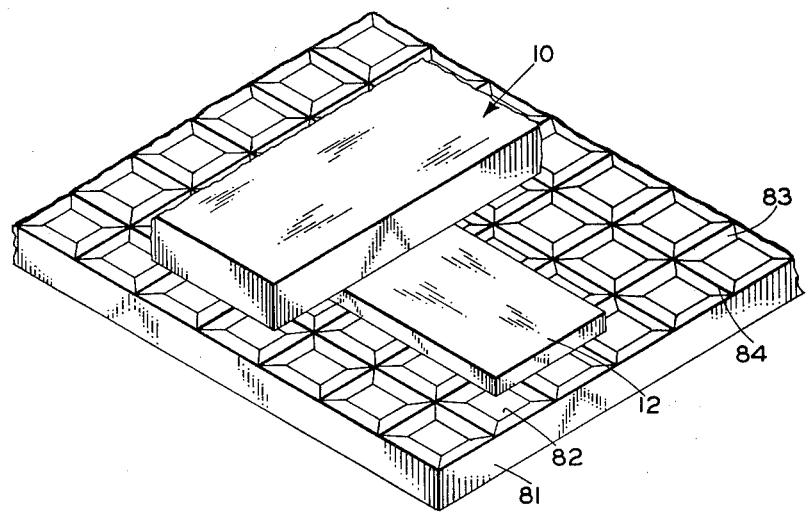
FIG. 23 shows a carrier having depressions formed in its surface to limit the pressure sensitive vacuum holding properties of the carrier.

Considering a still further feature of the invention, it was discovered that the holding effect of the pressure sensitive, vacuum holding layer can be reduced by forming a great number of small, shallow pockets separated by ridges in the surface of the layer. As shown in FIG. 23, a layer 81 is provided with a coordinate array of square pockets 82 separated by ridges 83, in one direction, and equal length ridges 84 in the transverse, orthogonal direction. The pockets may be tapered, 5 mils wide and 1 mil deep. When a beam lead device 10, having dimenstions of sufficient magnitude to span several pockets, is pressed against such a pocketed layer 81, the intitial holding force was found to be substantial, precluding easy separation of the device 10 from the layer 81. However, after a few minutes, this initial holding force was dissipated, permitting the easy removal of the device 10 by manipulation of a pair of tweezers or a vacuum probe. It is believed that the reduction of holding force is due to air leaking into the holding cavities or pockets 82.

Figure 24:
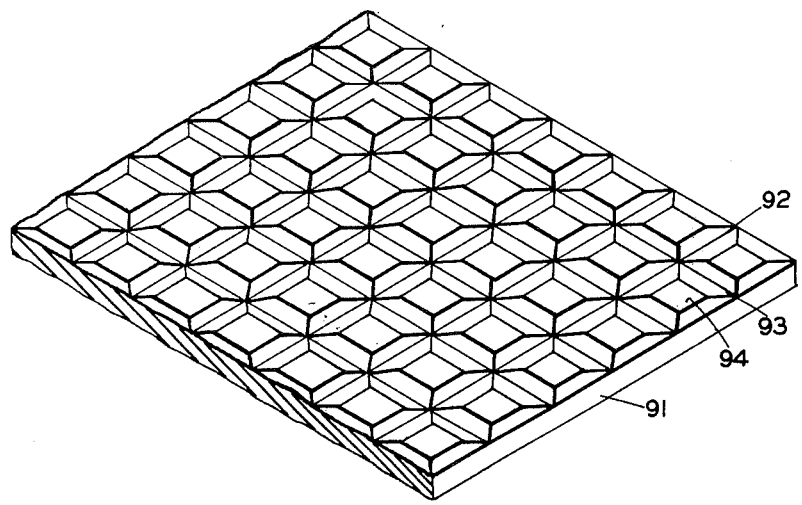
FIGS. 24, 25 and 26 illustrate a method of separating a frangible substrate and retaining the separated substrate on a pressure sensitive, vacuum holding carrier.
Figure 25:
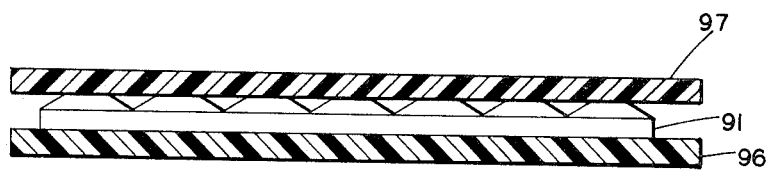
Figure 26:
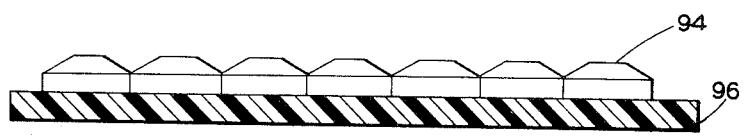

Attention is directed to FIGS. 22, 23 and 24 for a consideration of a further application of certain principles of the invention. In this instance, a slice 91 of frangible semiconductor material of the type used in the manufacture of transistors, is scribed or scored to provide orthographic grooves 92 and 93 to define individual transistor wafers 94. The scribed slice 91 is placed between a carrier sheet 96 of pressure sensitive, vacuum holding material and a flexible plastic sheet 97 which does not possess the property or ability to hold articles placed thereon. The plastic sheet may be constructed of a polyester sheet such as sold under the trade designation Mylar, by the E. I. du Pont de Nemours & Company. The sheets 96 and 97 and the intervening slice 91, are subject to flexing forces to sever the slice along the scored grooves 92 and 93. The slice, fractured along the scored lines, leaves the individual wafers 94 adhered to the pressure sensitive, vacuum holding sheet 96. The plastic sheet 97 is removed, leaving the wafers 94 in a coordinate array that is held to the carrier sheet 96.

A still further feature of the invention contemplates the transfer of objects, such as transistor devices 10, from a first sheet of pressure sensitive, vacuum holding material onto a second sheet of such material by merely providing the second sheet with greater holding ability. These increased holding abilities can be attained by providing the second sheet with either a smoother surface, or by making the second sheet thicker than the first sheet. In both instances, if the top and bottom surfaces of the transistor devices are equally smooth, then the pressing of the second sheet against the transistor devices on a first sheet results in a transfer and adherence of the devices to the second sheet upon subsequent separation of the sheets.

Figure 27:
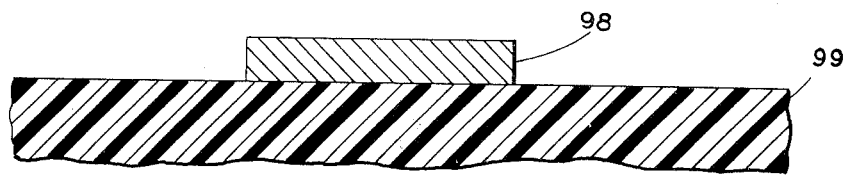
FIGS. 27 and 28 illustrate a method of relieving the holding force on an article by applying a swelling agent to a support constructed of pressure sensitive, vacuum holding material.
Figure 28:
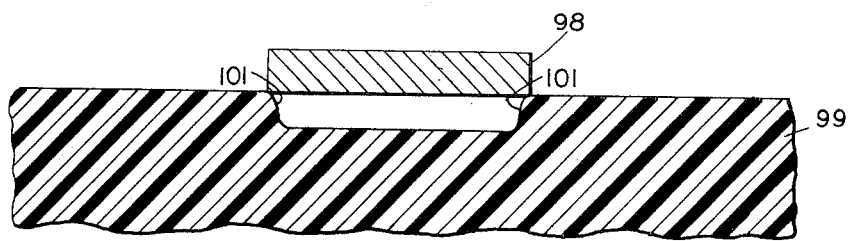

The holding force exerted by the pressure sensitive, vacuum holding material, may be relieved by spraying the exposed surfaces about the article with trichloroethylene. More particularly, referring to FIG. 27, there is shown an article 98 such as a transistor device supported on a carrier or layer of pressure sensitive, vacuum holding material 99 (silicone resin or silicone rubber). The exposed surface of the layer 99 about the article 98 is sprayed with trichloroethylene and the spray acts to expand or swell up the material 99 so that the material adjacent the peripheral edges 101 of the article actually lifts the article from the original surface in the manner illustrated in FIG. 28. The article 98 acts as a mask so that the bulk of the area underneath the article is not affected by the trichloroethylene. When the trichloroethylene evaporates, or is removed, the layer 99 returns to its original size. However, the article is now held by a significantly smaller force thereby facilitating easy removal of the article. The smaller force is due to the fact that the force urging the article into engagement is determined by the weight of the article. Of course, a strong holding force can be re-established by pressing the article against the surface of the layer.

An article, such as article 98, may be transferred from a first layer of pressure sensitive, vacuum holding material to a second layer by first spraying the first layer with trichloroethylene to reduce the vacuum holding force underneath the article and then pressing an untreated second layer of pressure sensitive, vacuum holding material against the article. When the layers are separated, the article will cling to the second layer.

Figure 31:
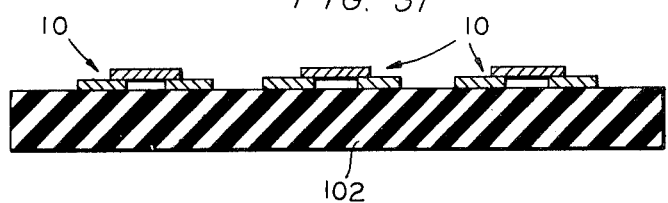
FIGS. 31, 32 and 33 graphically depict a further application of the principles of the invention wherein the distance between individual transistor devices of an array thereof is increased by stretching a substrate on which the array is temporarily held and, wherein the separated devices are transferred to a pressure sensitive, vacuum holding carrier.
Figure 32:
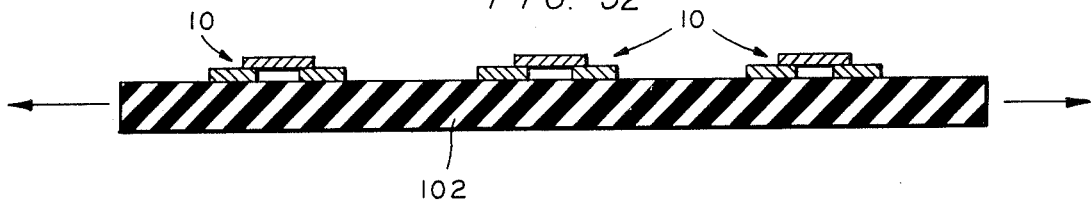
Figure 33:
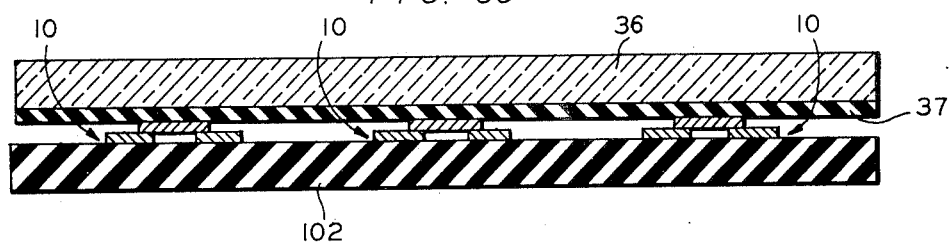

A still further feature of this invention contemplates the transfer of objects, such as transistor devices 10, from a resilient stretchable substrate 102 (see FIGS. 31 and 32) which has been stretched to increase the spacing between the devices. While the substrate 102 is in its stretched condition, a disc 36 having a coating of silicone rubber or resin 37 thereon is brought down over the separated devices 10 and into contact therewith, as illustrated in FIG. 33. A further description of the above described method of transferring separated devices 10 is set forth in U.S. Pat. No. 3,448,510 issued to J. R. Bippus and A. F. Johnson, which is assigned to the assignee of this application. The subject matter of that patent application is incorporated herein by reference.

It is to be understood that the above-described methods, arrangements of apparatus, and composition of elemental parts are simply illustrative of an application of the principles of the invention and many other modifications may be made without departing from the invention.

What is claimed is:

1. Apparatus for releasably holding an oriented array of articles and for transferring the articles, which comprises:
   a mounting constructed of material that releasably holds the articles in position;
   a carrier for receiving the articles from the mounting, the carrier being constructed of material selected from the group consisting of silicone rubber and silicone resin, each of which exhibits pressure sensitive, vacuum holding properties of sufficient magnitude to hold the articles in the original orientation upon release of the articles from the mounting; and
   means for abutting the carrier against the articles on the mounting and for separating the carrier and the mounting to effect a transfer of the articles to the carrier upon release of the articles by the mounting.

2. In an apparatus for transferring an oriented array of articles from a releasable support onto a carrier, wherein the carrier is constructed of a pressure sensitive, vacuum holding material selected from the group consisting of silicone resin and silicone rubber and, wherein the articles are held by the carrier after the article support is released:
   a carrier supporting pedestal having a nonplanar surface wherein an interior portion is elevated relative to the peripheral portions thereof;
   means for holding said releasable support over said pedestal; and
   means for forcing said releasable support into pressure engagement with said carrier positioned on said pedestal to deform said carrier about the elevated portion of said pedestal sufficiently to uniformly distribute compressional forces to press said article against the pressure sensitive, vacuum holding carrier whereupon said carrier hold said articles in said oriented array and for discontinuing said pressure engagement between said releasable support and said carrier to transfer the oriented array to said carrier upon release of the articles from the releasable support.

3. In an apparatus as defined in claim 1 including:
   a base having a vertically extending opening therein for receiving said carrier supporting pedestal; and
   means for selectively securing said pedestal in various vertical positions relative to said base and said holding means.

4. In an apparatus as defined in claim 3 including:
   a resilient mounting interposed between said base and said holding means for maintaining a space therebetween; and
   means for selectively adjusting the position of said resilient mounting to vary the distance between said base and said holding means.

* * * * *